(12) United States Patent
Rice et al.

(10) Patent No.: US 6,184,898 B1
(45) Date of Patent: Feb. 6, 2001

(54) WAVEFORM DISPLAY UTILIZING FREQUENCY-BASED COLORING AND NAVIGATION

(75) Inventors: Stephen V. Rice; Michael D. Patten, both of Nevada City, CA (US)

(73) Assignee: Comparisonics Corporation, Grass Valley, CA (US)

( * ) Notice: Under 35 U.S.C. 154(b), the term of this patent shall be extended for 0 days.

(21) Appl. No.: 09/048,642

(22) Filed: Mar. 26, 1998

(51) Int. Cl.[7] .................................................. G06T 11/20
(52) U.S. Cl. ........................ 345/440; 345/140; 345/133; 345/116
(58) Field of Search ..................................... 345/440, 140, 345/116, 35, 24, 133

(56) References Cited

U.S. PATENT DOCUMENTS 5,553,235 * 9/1996 Chen et al. ..................... 395/182.18
5,684,945 * 11/1997 Chen et al. ..................... 395/182.18

* cited by examiner

*Primary Examiner*—Jeffery Brier
*Assistant Examiner*—Motilewa Good-Johnson
(74) *Attorney, Agent, or Firm*—John Smith-Hill; Smith-Hill and Bedell

(57) ABSTRACT

Time evolution of a signal during a signal epoch is represented by a waveform display in which the foreground pixels in a column of pixels assigned to a time interval within the signal epoch are rendered with a color that depends on frequency-dependent information relating to a time segment that includes the time interval.

47 Claims, 3 Drawing Sheets

WAVEFORM DISPLAY UTILIZING FREQUENCY-BASED COLORING AND NAVIGATION

BACKGROUND OF THE INVENTION

This invention relates to a waveform display utilizing frequency-based coloring and navigation.

There are at least three well known representations of a signal:

1. The spectrum or frequency domain representation is a two-dimensional graph in which amplitude is plotted versus frequency. All points of the graph are normally plotted using the same color. Time information is not evident.

2. The spectrogram is a three-dimensional graph in which frequency is plotted versus time and the points of the graph are rendered using colors or shades of gray to convey amplitude information.

3. The waveform display or time domain representation is a two-dimensional graph in which amplitude is plotted versus time. All points of the graph are normally plotted using the same color. Frequency information is not evident.

FIG. 1 shows a portion 10 of a typical waveform display derived from an audio signal, i.e. an electrical signal containing audio frequency components. The waveform display shown in FIG. 1 is of the kind that might be presented by a display device having a display area composed of pixels 14 arranged in columns 18. For convenience, the pixels 14 are shown in FIG. 1 as having an aspect ratio (height: width) substantially less than one, but in practice the aspect ratio would normally be closer to one.

By way of example, the portion 10 of the waveform display represents an audio signal that has been sampled at intervals $\tau$ and has been quantized to return the twenty values indicated at the bottom of FIG. 1. Each column 18 of pixels is used to display a representation of the evolution of the signal over an interval $5\tau$, so that the twenty sample values are represented by four columns. Typically, the background color of the display is white and the amplitude information is plotted by rendering selected pixels 14 with a contrasting foreground color or black. The pixels in the column that are rendered with the foreground color (or black) show a line segment connecting the maximum and minimum sample values within the interval represented by the column. Thus, in the leftmost column the pixels from –2 to +5 are rendered with the foreground color (or black), represented by solid diagonal shading.

SUMMARY OF THE INVENTION

In accordance with a first aspect of the present invention there is provided an improved method of representing time evolution of a signal during a signal epoch using a rectangular array of pixels in which each column of pixels is assigned to a time interval within the signal epoch, and wherein foreground pixels in a column of pixels form a line segment connecting minimum and maximum amplitude values within the time interval to which the column is assigned, wherein the improvement resides in rendering the foreground pixels in a column with a color that depends on frequency-dependent information relating to a time segment that includes the time interval.

In accordance with a second aspect of the present invention there is provided an improved method of displaying information regarding a signal of which amplitude and frequency vary with time, in which the signal is used to generate a time domain representation of the amplitude of the signal as a foreground waveform against a background, wherein the improvement resides in varying the color with which the waveform is displayed as a function of frequency-dependent information obtained from the signal.

In accordance with a third aspect of the present invention there is provided a computer programmed to process a signal that evolves with time during a signal epoch by partitioning the signal epoch into a plurality of consecutive time segments, processing the signal to extract frequency-dependent information that characterizes each time segment, assigning a value to each time segment based on the frequency-dependent information that characterizes the time segment, receiving a user input to select a time segment of the signal, determining whether the value assigned to another time segment matches the value assigned to the user selected time segment, and, if so, providing an output which emphasizes at least one such time segment.

In accordance with a fourth aspect of the present invention there is provided a method of navigating a signal record, comprising partitioning the signal record into a plurality of consecutive segments, processing the signal to extract frequency-dependent information that characterizes each time segment, assigning a value to each time segment based on the frequency-dependent information that characterizes the time segment, selecting a time segment of the signal, determining whether the value assigned to another time segment matches the value assigned to the user selected time segment, and, if so, emphasizing at least one such time segment.

In accordance with a fifth aspect of the present invention there is provided a computer programmed to generate a representation of time evolution of a signal during a signal epoch using a rectangular array of pixels in which each column of pixels is assigned to a time interval within the signal epoch, and wherein foreground pixels in a column of pixels form a line segment connecting minimum and maximum amplitude values within the time interval to which the column is assigned, wherein the computer is programmed to render the foreground pixels in a column with a color that depends on frequency-dependent information relating to a time segment that includes the time interval.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 2:
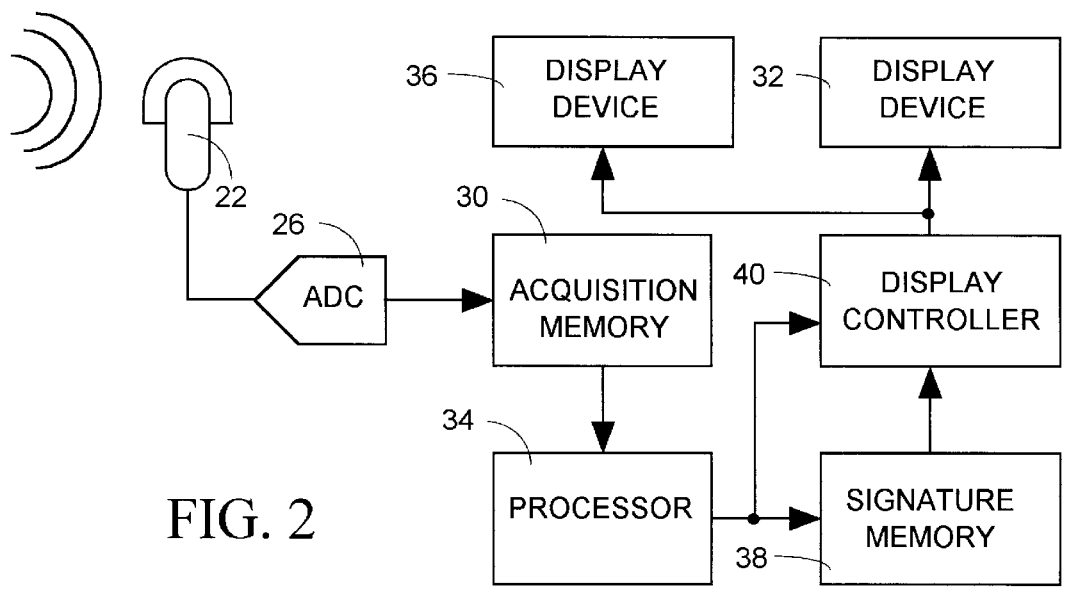
FIG. 2 is a block diagram of an apparatus for processing an acoustic signal to provide an enhanced waveform display.

Referring to FIG. 2, a microphone 22 receives an acoustic signal and converts it into an audio frequency analog electrical signal. An analog-to-digital converter (ADC) 26 samples the analog audio signal at 44.1 ks/sec and quantizes the samples to generate a digital audio signal composed of a succession of N1 sample values or words. The digital audio signal may be acquired from another source, such as playback of a compact disc or by digitizing an analog signal generated on playback of a tape recording. In any event, an audio data record in which each word represents the amplitude of the audio signal at a selected sampling time during a signal epoch is generated and is loaded into an acquisition memory 30. If, for example, the duration of the signal epoch is 200 seconds, the audio data record will contain $8.82 \times 10^6$ words.

A display controller 40 generates a video signal for controlling operation of a display device 32 to display pixels organized in a rectangular array composed of H rows and N2 columns. The display device 32 is able to display a palette of colors, and each pixel can be painted with any of the colors in the palette.

To render the waveform display of the signal as a bit-mapped image on the display device 32, each column of the array of pixels represents a distinct interval of the signal epoch containing C=N1/N2 sample values.

A processor 34 reads the audio data record and generates a pair of minimum and maximum amplitude values for each set of C consecutive sample values, corresponding to one of the N2 intervals of the signal epoch. The processor 34 supplies the pairs of minimum and maximum amplitude values to the display controller 40. The pairs of maximum and minimum values allow the display controller to generate a video signal specifying the foreground pixels of each column, forming a line segment connecting the minimum and maximum values within the interval represented by the column.

The processor 34 partitions the audio data record read from the acquisition memory 30 (FIG. 3, step 100) into N3 consecutive, contiguous, non-overlapping segments, where each segment consists of kC sample values, where k is an integer between 1 and N2. Thus, N3 is equal to N2/k, and each segment is represented by a distinct group of k consecutive columns of pixels. In this specification, the term "super column" is used to refer to the k columns of pixels associated with a given segment of the data record. In this manner, the audio signal epoch is divided into N3 consecutive, contiguous, non-overlapping time segments of equal duration. In a typical application, there might be one thousand segments and in the case of the example, each segment represents a signal interval of 0.2 s and contains 8,820 words.

The processor 34 analyzes each segment (step 104) to extract frequency-dependent information. For example, the processor might execute a Fast Fourier Transform or a Linear Prediction algorithm, in which case each segment of the audio data record is decomposed into multiple frequency components. The audio frequency spectrum is divided into several bands and a unique index value is associated with each band. For example, the audio spectrum may be divided into six bands and one might associate the index value 1 with the lowest frequency band, 2 with the second lowest frequency band, 3 with the third lowest frequency band, and so on, associating the index value 6 with the highest frequency band. The processor 34 determines which frequency band is dominant (step 108A), for example by determining which band contains the frequency components having the greatest amplitude, and assigns an index value P to that segment based on the location of the dominant frequency band in the audio spectrum (step 112A). The processor 34 also determines an amplitude variance value V for each segment (step 108B), for example based on the variance of the sample values used to form the segment. The data elements P and V for each segment are combined to create a signature (P, V) which contains both frequency information and amplitude variance information and characterizes the segment (step 116). The processor loads the signature in a signature memory 38 having N3 separate addressable memory locations (step 120).

The display controller 40 reads the signatures from the signature memory 38 and generates a video signal for controlling operation of the display device 32 such that the appearance of the foreground pixels in the ith super column of the display depends on the signature stored at the ith memory location in the signature memory. Specifically, the display controller generates the video signal such that the foreground pixels in the ith super column are painted with a color that depends on the element $P_i$ of the signature in the corresponding memory location of the signature memory. If red is considered a more active or urgent color than blue and correspondingly higher frequency sounds are considered more active or urgent than lower frequency sounds, it may be appropriate to associate shades of red with higher frequencies and shades of blue with lower frequencies. Thus, one might associate the colors red, orange, yellow, green, blue and violet with the index values 6, 5, 4, 3, 2 and 1 respectively.

Figure 1:
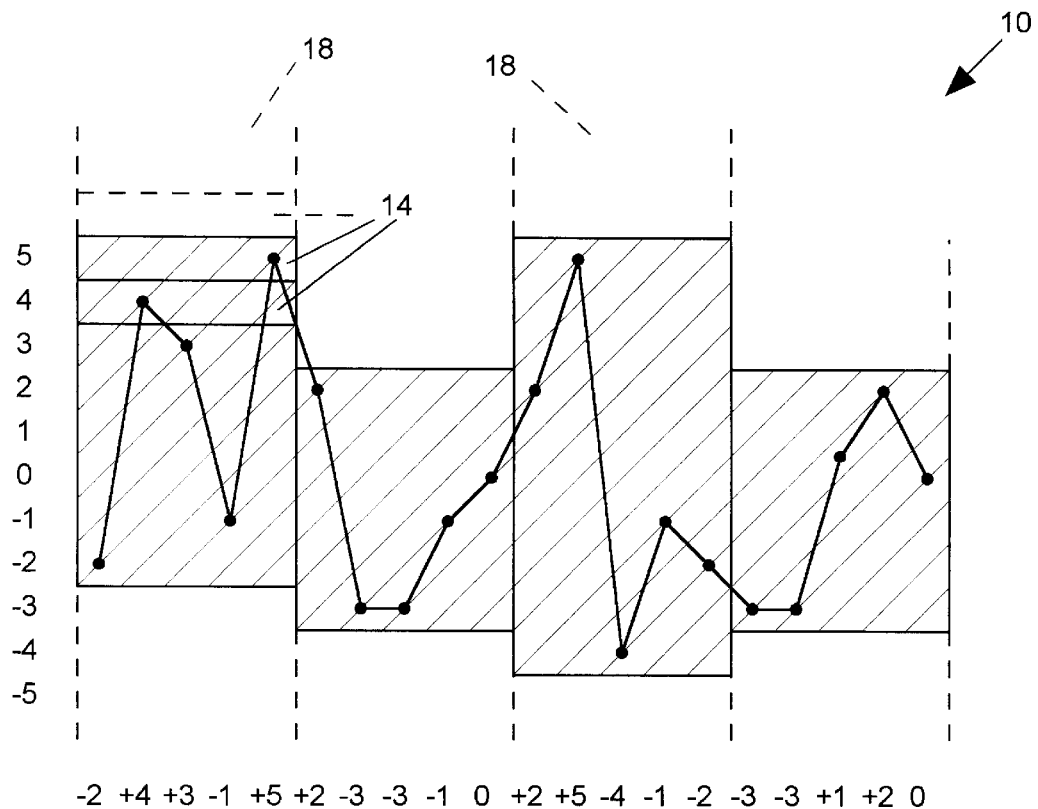
FIG. 1 is a graph illustrating a portion of a waveform display of an audio signal.
Figure 4:
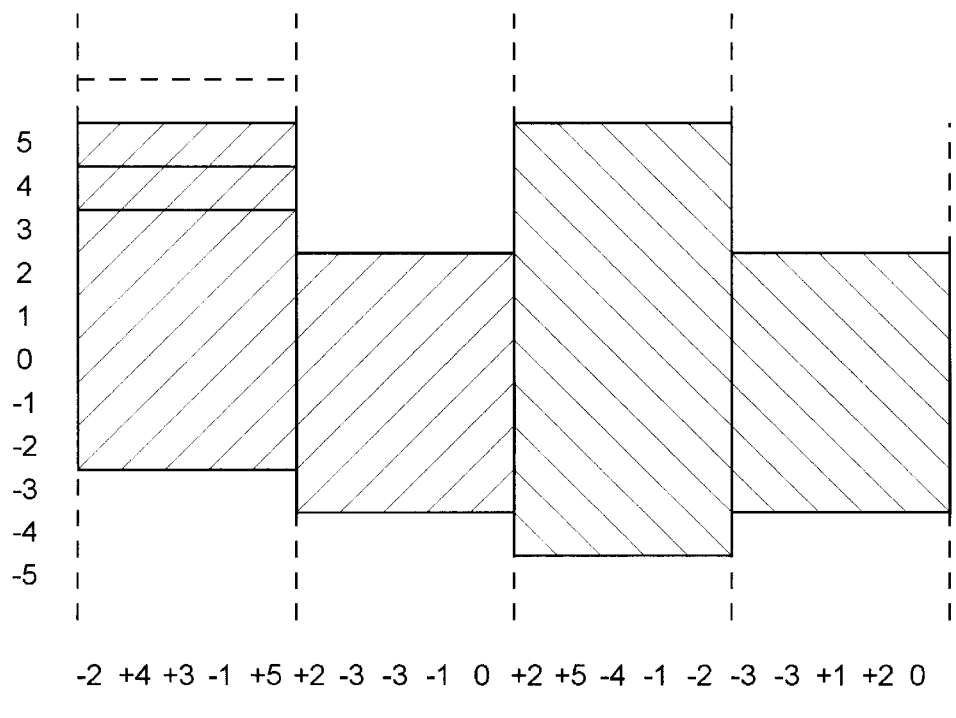
FIG. 4 is a graph illustrating a portion of an enhanced waveform display.

It will therefore be seen that the display device provides an display which is similar to the waveform display shown in FIG. 1 but is enhanced by rendering frequency information evident through variation in the foreground color. For example, in the case of the signal whose waveform is shown in FIG. 1, if k were equal to two, so that two columns of pixels form a super column, and the index value 6 were assigned to the segment corresponding to the columns at the left of FIG. 1 and the index value 2 were assigned to the segment corresponding to the columns at the right of FIG. 1, the enhanced display shown in FIG. 4 would be obtained, where the two orientations of diagonal shading represent red and blue respectively.

Although the foregoing discussion is directed to all the foreground pixels in each super column being displayed with the same color, it would be possible to display the foreground pixels in a given super column with more than one color. By way of example only, a given index value could be assigned to two colors, in which case some of the foreground pixels in the super column may be painted with one color and other foreground pixels in the super column may be painted with another color. The two groups of pixels may be interspersed, thus creating a third color, or the two groups of pixels may be discrete and continuous or the group of pixels of one color may be located between two sub-groups of pixels of the other color. The number of possible ways of utilizing the frequency-dependent information to control the color of the foreground pixels is very great, and no attempt has been made to be exhaustive.

A printer 36 is associated with the display device 32 and can provide a printout, e.g. on paper or a transparency medium, of the image shown on the display device 32. Thus, an image of only transient importance may be only displayed temporarily on the display device, but if an image is perceived to have enduring significance, it can be printed out using the printer to form a lasting record.

In the event that the display device 32 is able to display only W columns of pixels, where W is less than N2, the user may operate a horizontal scroll bar to bring into view any W consecutive columns of the image.

Figure 5:
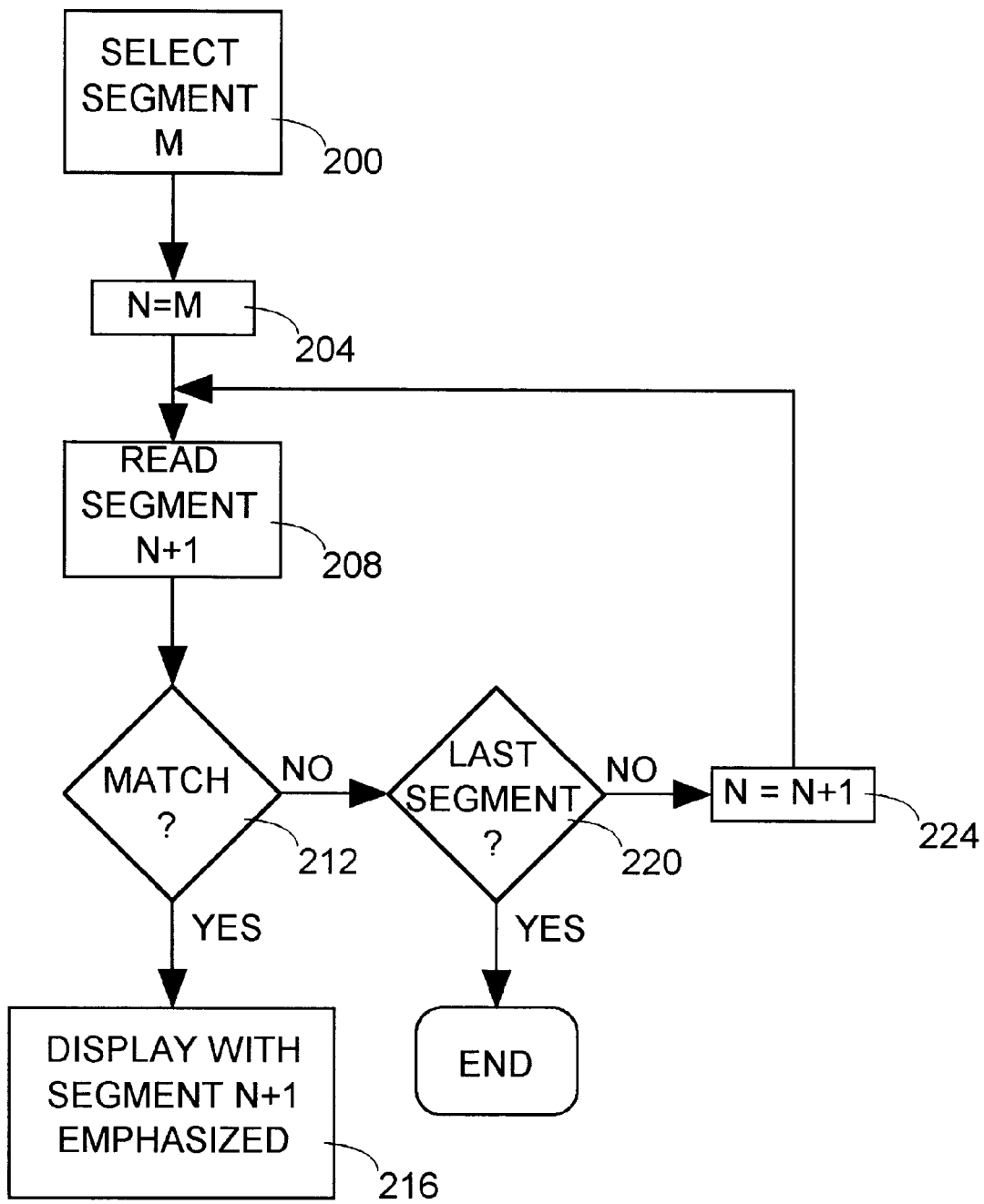
FIG. 5 is a flow chart illustrating a method in accordance with the invention.

The signatures stored in the signature memory can also be used to navigate the audio data record. Referring to FIG. 5, the user can select (step 200) a particular segment (segment M) of the audio data record by using a cursor to identify a super column of the display while viewing the waveform. The processor 34 retrieves the signature for segment M of the audio data record from the signature memory and compares other signatures with the signature for segment M, using both the frequency information and the amplitude variance information, in order to identify signatures that match the signature for segment M within a desired tolerance. As shown in FIG. 5, this may be accomplished by setting a variable N equal to M (step 204), reading the signature for segment N+1 from the signature memory (step 208) and comparing it with the signature for segment M (step 212). If the two signatures match within the desired tolerance, the processor 34 instructs the display controller to alter the display by emphasizing or drawing attention to the super column corresponding to segment N+1 of the audio data record (step 216), for example by moving the cursor of the display to point to this super column. If the signatures do not match, the process determines whether segment N+1 is the last segment, i.e. N+1=N3 (step 220) and, if so, the process terminates. Otherwise, the variable is incremented (step 224) and the process returns to step 208.

In the process described with reference to FIG. 5, the segments having signatures that match the signature for segment M are located by reading forward from segment M. Alternatively, the matching segments may be located by examining all the signatures from the start of the signature memory or by reading backward from the selected segment, or in another convenient fashion, depending on user commands. The signatures may be compared until a selected number of matches have been accumulated, including only a single match, or until all signatures have been compared. The user can move the cursor forward or backward from one matching segment to another, for example by pressing direction arrow keys or invoking other standard cursor movement commands.

The weight to be accorded to amplitude variance in the matching process can be selected by the user. For example, the user may wish to base the matching only on the color component of the signature, in which case no weight would be accorded to amplitude variance.

Figure 3:
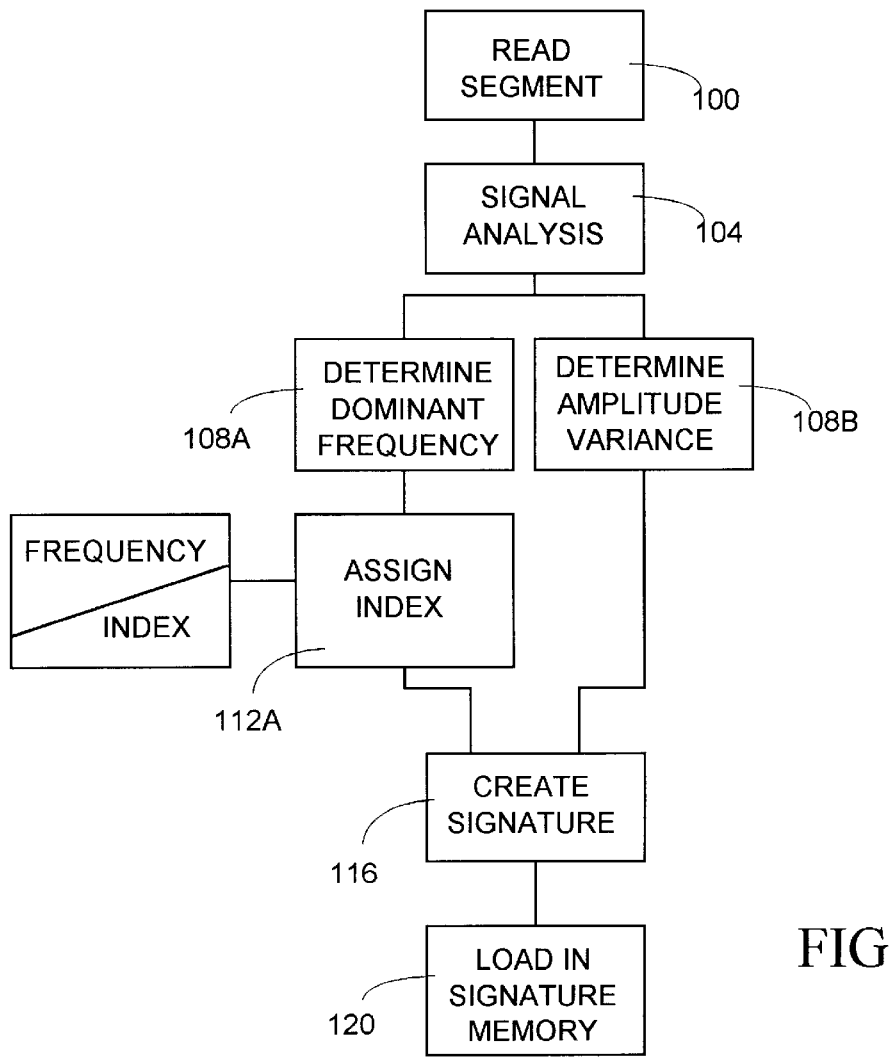
FIG. 3 is a diagram illustrating signal processing in the apparatus shown in FIG. 1.

It would also be possible to select a segment of the audio data record by invoking a select command while listening to the acoustic signal concurrently with processing the acoustic signal in the manner described with reference to FIGS. 2 and 3 to generate the signatures, or while listening to a replica of the acoustic signal created by playing back the audio data record stored in the acquisition memory, through a digital-to-analog converter and a loudspeaker. In the former case, it may be necessary to wait briefly while the digital audio signal is processed before it will be possible to navigate the audio data record.

The process described with reference to FIG. 5 is not restricted to matching a single segment with other segments, and the user may select a sequence of consecutive segments and have this sequence compared with every other sequence of segments to locate matches.

Although it is normally preferred that the waveform should be displayed in color, as described with reference to FIGS. 2 and 3, it is not necessary to do so when using the signatures to navigate the audio data record as described with reference to FIG. 5, and in this case the display could be monochrome.

It will be appreciated that the invention is not restricted to the particular embodiment that has been described, and that variations may be made therein without departing from the scope of the invention as defined in the appended claims and equivalents thereof. For example, although the foregoing description refers to a method in which the segments are non-overlapping and each corresponds to the same length of time, and the segmentation is accomplished automatically, the segmentation could be performed in response to user input, wholly or in part, and the segments may correspond to time intervals of non-uniform length and intervals that are overlapping. Particularly, if the signal remains uniform (within specified limits) in amplitude and frequency for considerable periods of time, a single segment may correspond to a longer time interval than if the signal changes relatively rapidly in amplitude or frequency. Further, although the foregoing description is concerned with extracting information regarding the dominant frequency, information regarding subordinate frequencies may also be used to determine the color or colors used to paint a super column. Moreover, the functions and arrangement of the blocks shown in FIG. 2 were chosen in order to facilitate discussion of signal flow and the invention is not restricted to use of the specific functional blocks shown in FIG. 2, arranged and connected in the manner shown in FIG. 2. For example, although the display controller 40 is shown in FIG. 2 as a distinct block from the processor 34, its function may be performed by the processor 34.

We claim:

1. An improved method of representing time evolution of a signal during a signal epoch using a rectangular array of pixels in which each column of pixels is assigned to a time interval within the signal epoch, and wherein foreground pixels in a column of pixels form a line segment connecting smaller and greater amplitude values within the time interval to which the column is assigned, wherein the improvement resides in rendering the foreground pixels in a column with a color that depends on frequency-dependent information relating to a time segment that includes the time interval.

2. A method according to claim 1, comprising rendering all the foreground pixels in the column with the same color.

3. A method according to claim 1, comprising rendering the foreground pixels in the column with at least two colors.

4. A method according to claim 1, wherein the smaller and greater amplitude values are minimum and maximum amplitude values.

5. A method according to claim 1, comprising:
   (a) partitioning the signal epoch into a plurality of consecutive time segments each of a duration corresponding to at least one column of the display,
   (b) processing the signal to extract frequency-dependent information relating to each time segment,
   (c) assigning a color to each time segment based on the frequency-dependent information relating to the time segment, and
   (d) rendering the foreground pixels of each column in the time segment with the color assigned in step (c).

6. A method according to claim 5, comprising creating an image on a transient display.

7. A method according to claim 5, comprising creating an image on a sheet form medium.

8. A method according to claim 5, wherein the time segments are contiguous.

9. A method according to claim 5, wherein the time segments are of equal duration.

10. A method according to claim 5, wherein the time segments are not of equal duration.

11. A method according to claim 5, wherein the time segments are non-overlapping.

12. A method according to claim 5, wherein the time segments are overlapping.

13. A method according to claim 5, comprising partitioning the signal epoch into segments automatically.

14. A method according to claim 5, comprising partitioning the signal epoch into segments in response to user input.

15. A method according to claim 5, wherein step (b) comprises extracting frequency-dependent information depending on a dominant frequency in the segment.

16. A method according to claim 5, wherein step (b) comprises extracting frequency-dependent information depending on a subordinate frequency in the segment.

17. An improved method of displaying information regarding a signal of which amplitude and frequency vary with time, in which the signal is used to generate a time domain representation of the amplitude of the signal as a foreground waveform against a background, wherein the improvement resides in varying the color with which the waveform is displayed as a function of frequency-dependent information obtained from the signal.

18. A computer programmed to process a signal that evolves with time during a signal epoch by:
  (a) partitioning the signal epoch into a plurality of consecutive time segments,
  (b) processing the signal to extract frequency-dependent information that characterizes each time segment,
  (c) assigning a value to each time segment based on the frequency-dependent information that characterizes the time segment,
  (d) receiving a user input to select a time segment of the signal,
  (e) determining whether the value assigned to another time segment matches the value assigned to the user selected time segment, and, if so,
  (f) providing an output which emphasizes at least one such time segment.

19. A computer according to claim 18, wherein step (d) comprises receiving a user input to select a sequence of consecutive time segments and step (e) comprises determining whether the values assigned to another sequence of consecutive time segments match the values assigned to the user selected sequence of time segments.

20. A computer according to claim 18, including a display device for displaying a monochrome representation of the time evolution of the signal during at least a part of the signal epoch.

21. A computer according to claim 18, programmed to partition the signal epoch into contiguous time segments.

22. A computer according to claim 18, programmed to partition the signal epoch into time segments of equal duration.

23. A computer according to claim 18, programmed to partition the signal epoch into time segments not of equal duration.

24. A computer according to claim 18, programmed to partition the signal epoch into time segments that are non-overlapping.

25. A computer according to claim 18, programmed to partition the signal epoch into time segments that are overlapping.

26. A computer according to claim 18, programmed to partition the signal epoch into segments automatically.

27. A computer according to claim 18, programmed to partition the signal epoch into segments in response to user input.

28. A computer according to claim 18, programmed to extract frequency-dependent information depending on a dominant frequency in the segment.

29. A computer according to claim 18, programmed to extract frequency-dependent information depending on a subordinate frequency in the segment.

30. A computer according to claim 19, programmed to display a representation of the time evolution of the signal during at least a part of the signal epoch, and wherein step (d) comprises receiving the user input based on the display.

31. A computer according to claim 30, wherein step (f) includes adjusting the display.

32. A computer according to claim 30, programmed to associate a color with each value assigned in step (c) and display each time segment using the color associated with the value assigned to the time segment.

33. A computer according to claim 30, programmed to scroll the display to illustrate said one segment.

34. A computer according to claim 19, programmed to extract amplitude-dependent information relating to each segment and to create a data structure including the frequency-dependent information and the amplitude-dependent information.

35. A computer according to claim 34, wherein the amplitude-dependent information is a value of amplitude variance during the segment.

36. A computer according to claim 34, programmed to assign a value to each time segment based on both the frequency-dependent information and the amplitude-dependent information.

37. A computer according to claim 19, programmed to display a representation of the time evolution of the signal during at least a part of the signal epoch and to emphasize at least one such segment by moving a cursor to call attention to said segment.

38. A computer according to claim 37, programmed to displace the cursor to a matching segment in response to a user command.

39. A computer according to claim 18, programmed to create an image representing time evolution of the signal during the signal epoch using a rectangular array of pixels in which each column of pixels is assigned to a time interval within the signal epoch, and wherein foreground pixels in a column of pixels form a line segment connecting smaller and greater amplitude values within the time interval to which the column is assigned and are rendered with a color that depends on the frequency-dependent information that characterizes the time segment that includes the time interval.

40. A computer according to claim 39, programmed to render all the foreground pixels in the column with the same color.

41. A computer according to claim 39, programmed to render the foreground pixels in the column with at least two colors.

42. A computer according to claim 39, wherein the smaller and greater amplitude values are minimum and maximum amplitude values.

43. A method of navigating a signal record, comprising:
  (a) partitioning the signal record into a plurality of consecutive segments,
  (b) processing the signal record to extract frequency-dependent information that characterizes each time segment,
  (c) assigning a value to each time segment based on the frequency-dependent information that characterizes the time segment,
  (d) selecting a time segment of the signal record, (e) determining whether the value assigned to another time segment matches the value assigned to the user selected time segment, and, if so, (f) emphasizing at least one such time segment.

44. A computer programmed to generate a representation of time evolution of a signal during a signal epoch using a rectangular array of pixels in which each column of pixels is assigned to a time interval within the signal epoch, and wherein foreground pixels in a column of pixels form a line segment connecting smaller and greater amplitude values within the time interval to which the column is assigned, wherein the computer is programmed to render the foreground pixels in a column with a color that depends on frequency-dependent information relating to a time segment that includes the time interval.

45. A computer according to claim 44, wherein the smaller and greater amplitude values are minimum and maximum amplitude values.

46. An improved method of analyzing a signal, comprising:

(a) processing the signal to extract frequency-dependent information that characterizes a time segment of the signal, (b) assigning a value to the time segment based on the frequency-dependent information that characterizes the time segment, and (c) comparing the value assigned in step (b) with a datum value.

47. A method according to claim 46, comprising the step of deriving the datum value by:

(A) partitioning a signal into a plurality of consecutive time segments, (B) processing the signal of step (A) to extract frequency-dependent information that characterizes each time segment, (C) assigning a value to each time segment based on the frequency-dependent information that characterizes the time segment, (D) selecting a time segment of the signal of step (A), and (E) selecting the value that characterizes the time segment selected in step (D) as the datum value.

* * * * *

UNITED STATES PATENT AND TRADEMARK OFFICE
CERTIFICATE OF CORRECTION

PATENT NO. : 6,184,898 B1
DATED : February 6, 2001
INVENTOR(S) : Stephen V. Rice & Michael D. Patten It is certified that error appears in the above-identified patent and that said Letters Patent is hereby corrected as shown below:

Column 8,
Line 4 (claim 30, line 1), "19" should be deleted and replaced with -- 18 --.
Line 16 (claim 34, line 1), "19" should be deleted and replaced with -- 18 --.
Line 28 (claim 37, line 1), "19" should be deleted and replaced with -- 18 --.

Signed and Sealed this

Twenty-third Day of October, 2001

Attest:

NICHOLAS P. GODICI
Attesting Officer    Acting Director of the United States Patent and Trademark Office